US011833584B2

(12) United States Patent
Zhu et al.

(10) Patent No.: US 11,833,584 B2
(45) Date of Patent: Dec. 5, 2023

(54) ALLOY ALUMINUM PASTE FOR USE ON REAR OF PERC SOLAR CELL

(71) Applicant: NANTONG T-SUN NEW ENERGY CO., LTD., Nantong (CN)

(72) Inventors: Peng Zhu, Nantong (CN); Guizhong Yang, Nantong (CN); Xinjian Chen, Nantong (CN); Haibo Xu, Nantong (CN); Yeqing Wang, Nantong (CN)

(73) Assignee: NANTONG T-SUN NEW ENERGY CO., LTD., Nantong (CN)

( * ) Notice: Subject to any disclaimer, the term of this patent is extended or adjusted under 35 U.S.C. 154(b) by 205 days.

(21) Appl. No.: 17/431,372

(22) PCT Filed: Jul. 12, 2019

(86) PCT No.: PCT/CN2019/095753
§ 371 (c)(1),
(2) Date: Aug. 16, 2021

(87) PCT Pub. No.: WO2020/252828
PCT Pub. Date: Dec. 24, 2020

(65) Prior Publication Data
US 2022/0134422 A1 May 5, 2022

(30) Foreign Application Priority Data
Jun. 19, 2019 (CN) .......................... 201910529096.3

(51) Int. Cl.
*B22F 1/107* (2022.01)
*B22F 1/05* (2022.01)
*H01L 31/0224* (2006.01)

(52) U.S. Cl.
CPC ................ *B22F 1/107* (2022.01); *B22F 1/05* (2022.01); *H01L 31/022425* (2013.01); *B22F 2301/052* (2013.01); *B22F 2304/10* (2013.01)

(58) Field of Classification Search
CPC ......... H01L 31/02168; H01L 31/02167; H01L 31/0224; H01L 31/022441; H01L 31/022425; H01L 31/0682; H01L 31/18; B22F 1/05; B22F 1/052; B22F 1/107; B22F 2301/052; B22F 2304/10
See application file for complete search history.

(56) References Cited

U.S. PATENT DOCUMENTS

2019/0156966 A1* 5/2019 Zhu ................. H01L 31/022425

FOREIGN PATENT DOCUMENTS

| CN | 106935309 A | * | 7/2017 | ............... H01B 1/22 |
| WO | WO-2018040569 A1 | * | 3/2018 | ............... H01B 1/22 |

* cited by examiner

*Primary Examiner* — Mayla Gonzalez Ramos
(74) *Attorney, Agent, or Firm* — CBM PATENT CONSULTING, LLC

(57) ABSTRACT

Based on 100 wt % of the alloy aluminum paste, the alloy aluminum paste includes the following components in percentages by weight: 35-56.5% of an aluminum-silicon alloy powder, 17.5-37.5% of an aluminum powder, 1-2% of a lead-free glass powder, 15-20% of an organic solvent, 3-5% of ethyl cellulose, 0.05-0.1% of a thixotropic agent and 0.5-1.5% of a dispersant. The alloy paste can be applied to a PERC solar cell having a passivation coating opening consisting of 0.5-1% of the area of the solar cell. When the alloy aluminum paste is applied to a PERC solar cell having a low opening rate, particularly a rear electrode having a passivation coating opening consisting of 0.5-1% of the area of the solar cell.

10 Claims, No Drawings

ALLOY ALUMINUM PASTE FOR USE ON REAR OF PERC SOLAR CELL

TECHNICAL FIELD

The present invention relates to an aluminum paste for a rear of a solar cell, and in particular to an alloy aluminum paste for use on a rear of a PERC solar cell.

BACKGROUND

PERC, i.e., passivated emitter rear contact, is a technology for forming a passivation layer on the rear of a solar cell so as to improve the conversion efficiency. PERC cells have the advantages such simple processing, cost-efficiency and high compatibility with the existing cell production lines, and is expected to lead the orientation of high-efficiency solar cells in the future.

PERC technology improves the conversion efficiency by adding a dielectric passivation layer on rear of a cell. In a standard cell structure, efficiency is limited by the recombination tendency of photo-generated electrons. PERC cells can maximize the potential gradient across the P-N junction, which allows a more stable flow of electrons, reduced electron recombination, and a higher level of efficiency.

PERC cells are characterized by: (1) passivation coatings deposited on both the front and rear of the cell; (2) a local contact with the silicon substrate by directly applying a back surface field aluminum paste to the rear passivation coating. According to the structural features of PERC cells, the cells require double-sided passivation and local contact on the rear to greatly reduce the surface recombination and thus to improve the conversion efficiency of the cell. The double-sided passivation requires dielectric coatings plated on both sides of the cell, and the local contact on the rear requires an opening on the rear coating. Therefore, the process flow for PERC cells is as follows: (1) alkali texturing; (2) $POCl_2$ diffusion; (3) rear wet etching; (4) double-sided passivation coating; (5) hole opening on the rear dielectric coating; and (6) metallization, wherein in the PERC cell metallization process, the screen printing process can still be employed, but the rear of the PERC cell sets down different requirements on the performance of the conductive paste than on a conventional cell paste.

In local metallization stage of the rear, voids may occur in the aluminum back surface field, where no aluminum back surface field is formed in local metal contact regions and silicon dissolves into the aluminum paste, forming the voids and leading to an increase in contact resistance and a decline in fill factor. Thus PERC cells have the following basic requirements on the rear aluminum paste: (1) a good filling effect at the openings of the coating; (2) minimized damage to the dielectric coating; (3) a continuous and uniform aluminum local back surface field (LBSF) of a proper thickness; and (4) good reliability, such as adhesion and aging resistance. With the rapid development of PERC cells, the market demand for the metal conductive paste designated for the PERC cell is growing.

Taiwanese Patent No. TW201827530A provides a paste composition for a solar cell. The invention provides a paste composition, and particularly, a paste composition for a solar cell comprising a glass powder, an organic vehicle and a conductive material, wherein: (1) the conductive material comprises more than 40 wt % of an Al—X alloy powder having a melting point between 660° C. and 800° C.; (2) the element X of the Al—X alloy powder is at least one selected from silicon, barium, bismuth, calcium, germanium, indium, lanthanum, nickel, lead, antimony, strontium, tellurium and yttrium. However, the alloy paste prepared using this process has a low gap filling rate in a PERC solar cell having a passivation coating opening consisting of 0.5-1% of the solar cell area, and the BSF layer formed is irregular.

SUMMARY

Purpose: In order to solve the above problems, the present invention provides an alloy aluminum paste for use on a rear of a PERC solar cell. The paste features a high gap filling rate, the capability of forming a regular BSF layer and low corrosivity. The specific technical scheme is described as follows.

Technical Scheme: The present invention is intended to provide an alloy aluminum paste for use on a rear of a PERC solar cell, wherein based on 100 wt % of the alloy aluminum paste, the alloy aluminum paste comprises the following components in percentages by weight:

| | |
|---|---|
| an aluminum-silicon alloy powder | 35-56.5%; |
| an aluminum powder | 17.5-37.5%; |
| a lead-free glass powder | 1-2%; |
| an organic solvent | 15-20%; |
| ethyl cellulose | 3-5%; |
| a thixotropic agent | 0.05-0.1%; and |
| a dispersant | 0.5-1.5%; | the aluminum-silicon alloy powder and the aluminum powder have a weight ratio of 1:1-3:1; the aluminum-silicon alloy has a median particle size $D_{50}$ of 5-6 μm and an oxygen content of 0.3-0.4 wt %; the aluminum powder has a median particle size $D_{50}$ of 7-8 μm, and an oxygen content of 0.35-0.45 wt %.

In some embodiments of the present invention, the lead-free glass powder is prepared by mixing a glass powder A and a glass powder B; based on 100 wt % of the lead-free glass powder, the glass powder A consists of 60-90% by weight and the glass powder B consists of 10-40% by weight; the glass powder A has a median particle size $D_{50}$ of 1-3 μm and a softening temperature of 500-600° C.; the glass powder B has a median particle size $D_{50}$ of 1.3-1.8 μm and a softening temperature of 400-450° C.

In some embodiments of the present invention, based on 100 wt % of the glass powder A, the glass powder A is prepared from 0-40% of ZnO, 1-40% of $B_2O_3$, 30-40% of $Sb_2O_3$ and 0-70% of $M_xN_y$ by weight, wherein the element M is an alkali metal or alkaline earth metal, the element N is at least one selected from O or $CO_3$ and a halogen, x is 1 or 2, and y is 1 or 2.

In some embodiments of the present invention, the element M is preferably at least one selected from Ba, Ca, Sr, Na, K, Rb and Cs.

In some embodiments of the present invention, based on 100 wt % of the glass powder B, the glass powder B is prepared from 10-50% of $V_2O_5$, 0-30% of ZnO, 5-40% of $B_2O_3$, 0-20% of $P_2O_5$ or $P_2(CO_3)_5$, 0-20% of $WO_3$ or $MoO_3$, and 10-40% of $RQ_z$, wherein the element R is an alkaline earth metal, the element Q is at least one selected from O or $CO_3$ or a halogen, and z is 1 or 2.

In some embodiments of the present invention, the element R is preferably at least one selected from Ba, Ca and Sr.

In some embodiments of the present invention, the organic solvent has a boiling point of 170-250° C.

In some embodiments of the present invention, the organic solvent is one or more selected from butyl carbitol, butyl carbitol acetate, texanol, ethylene glycol butyl ether, terpineol and turpentine.

In some embodiments of the present invention, the dispersant is one or a mixture of more selected from TDO, sorbitan trioleate, BYK-110 and BYK-111.

TDO is a special dual-ion long-chain super wetting dispersant, and is suitable for preparing various aqueous and oily organic and inorganic coating pastes. As TDO has high surface activity, it has remarkable performance. TDO enables the paste to migrate during the curing process of the painted coating and to firmly adhere to a solid surface, so as to give an ideal effect.

BYK-110 deflocculates the paste by steric hindrance. High gloss and increased color intensity can be provided due to the low particle size in the deflocculated paste. In addition, transparency and hiding power are increased. Such products have reduced viscosity and thus improved leveling property. Therefore, the paste content can be increased.

BYK-111 is a solvent-free wetting dispersant for solvent-based and solvent-free pastes and printing inks, and can stabilize inorganic pigments, especially titanium dioxide. The viscosity of the grinding material is significantly reduced.

In all the above embodiments, the alloy aluminum paste is applied to a PERC solar cell having a passivation coating opening consisting of 0.5-1% of the area of the solar cell.

Beneficial Effects: The present invention has the following advantages:

The formula of the alloy aluminum paste for use on a rear of a PERC solar cell of the present invention further comprises 35-56.5 wt % of an aluminum-silicon alloy, wherein the aluminum-silicon alloy has a median particle size $D_{50}$ of 5-6 μm and an oxygen content of 0.3-0.4 wt %; the aluminum powder has a median particle size $D_{50}$ of 7-8 μm and an oxygen content of 0.35-0.45 wt %. The aluminum-silicon alloy can improve the activity of the alloy paste, thereby improving the gap filling rate of the alloy paste.

The alloy aluminum paste for use on a rear of a PERC solar cell is reasonable in formula, and is suitable for the PERC solar cell having a low opening rate, particularly a rear electrode having a passivation coating opening consisting of 0.5-1% of the area of the solar cell. The alloy aluminum paste of the present invention has advantages of good gap filling rate, complete and uniform BSF layer, reduced aluminum beads, and good boiling and adhesive performance.

According to the formula of the alloy aluminum paste for use on a rear of a PERC solar cell of the present invention, the organic solvent adopted has a boiling point of 170-250° C., and the wettability and volatility of butyl carbitol, butyl carbitol acetate, texanol, ethylene glycol butyl ether, terpineol and turpentine are good, leading to less damage to the silicon substrate by the organic vehicle during sintering.

According to the formula of the alloy aluminum paste for use on a rear of a PERC solar cell of the present invention, a mixture of two glass powders is adopted. Both the two glass powders are free of Pb, and thus completely meet the requirements on environmental protection. In the present invention, a composite glass powder is adopted. The glass powder of the present invention is slightly alkaline, which can effectively reduce the corrosivity of the glass powder to the silicon substrate.

DETAILED DESCRIPTION

The technical schemes in the embodiments of the present invention will be clearly and completely described below, for a better understanding of the advantages and features of the present invention by those skilled in the art, and for a more the clearly defined protection scope of the present invention. The described embodiments are only some, but not all, embodiments of the invention. Based on the embodiments of the present invention, all other embodiments obtained by those of ordinary skill in the art without making any creative effort will fall within the protection scope of the present invention.

Example 1

1. Preparation of Lead-Free Glass Powder

Preparation of glass powder A: Based on 100 wt % of the glass powder A, 20% of ZnO, 20% of $B_2O_3$, 35% of $Sb_2O_3$, 5% of $BaCl_2$, 10% of $Na_2CO_3$ and 10% of $Rb_2O_2$ were prepared. In this example, $BaCl_2$ was adopted, although metal compounds of the other halogen elements were also possible by adjusting their ratios. The materials were then well mixed using a known mixer such as a disperser or a three-roll mill, and dried for 3.5 h before being transferred into a crucible. The crucible containing the starting materials was first heated to 950° C. in a heating chamber, and then incubated for 1.5 h. The resultant liquid of the smelted materials was allowed to pass through a cooling roller to give a glass frit, which was then crushed and sieved to give the glass powder A having a median particle size $D_{50}$ of 1.36 μm and a softening temperature of 544.7° C.

Preparation of glass powder B: Based on 100 wt % of the glass powder B, 30% of $V_2O_5$, 15% of ZnO, 22% of $B_2O_3$, 10% of $P_2O_5$, 10% of $WO_3$, 5% of $BaCO_3$ and 8% of CaO were prepared. The materials were then well mixed using a known mixer such as a disperser or a three-roll mill, and dried for 3 h before being transferred into a crucible. The crucible containing the starting materials was first heated to 1000° C. in a heating chamber, and then incubated for 1 h. The resultant liquid of the smelted materials was allowed to pass through a cooling roller to give a glass frit, which was then crushed and sieved to give the glass powder B having a median particle size $D_{50}$ of 1.33 μm and a softening temperature of 405° C.

2. Preparation of Alloy Paste

Based on 100 wt % of the alloy aluminum paste, the alloy aluminum paste of the present invention was prepared from the following components in percentages by weight:

| | |
|---|---|
| an aluminum-silicon alloy powder | 48.425%; |
| an aluminum powder | 27.5%; |
| the glass powder A | 1.125%; |
| the glass powder B | 0.375%; |
| ethylene glycol butyl ether | 17.5%; |
| ethyl cellulose | 4%; |
| polyamide wax | 0.075%; and |
| sorbitan trioleate | 1%; | wherein the aluminum-silicon alloy has a median particle size $D_{50}$ of 5.5 μm and an oxygen content of 0.35 wt %; the aluminum powder has a median particle size $D_{50}$ of 7.5 μm and an oxygen content of 0.4 wt %; the organic solvent ethylene glycol butyl ether has a boiling point of 227° C. The above prepared materials were mixed according to the ratios, and then ground and dispersed such that the fineness of the prepared paste did not exceed 15 μm.

Example 2

1. Preparation of Lead-Free Glass Powder

Preparation of glass powder A: Based on 100 wt % of the glass powder A, 40% of ZnO, 5% of $B_2O_3$, 30% of $Sb_2O_3$, 5% of SrCl, 10% of $Cs_2CO_3$ and 10% of BaO were prepared. In this example, SrCl was adopted, although metal compounds of the other halogen elements were also possible by adjusting their ratios. The materials were then well mixed using a known mixer such as a disperser or a three-roll mill, and dried for 3 h before being transferred into a crucible. The crucible containing the starting materials was first heated to 850° C. in a heating chamber, and then incubated for 2 h. The resultant liquid of the smelted materials was allowed to pass through a cooling roller to give a glass frit, which was then crushed and sieved to give the glass powder A having a median particle size $D_{50}$ of 1.89 µm and a softening temperature of 570° C.

Preparation of glass powder B: Based on 100 wt % of the glass powder B, 50% of $V_2O_5$, 5% of ZnO, 5% of $B_2O_3$, 5% of $P_2(CO_3)_5$, 5% of $WO_3$, 15% of $Sr_2CO_3$ and 15% of $CaI_2$ were prepared. In this example, $CaI_2$ was adopted, although metal compounds of the other halogen elements were also possible by adjusting their ratios. The materials were then well mixed using a known mixer such as a disperser or a three-roll mill, and dried for 3 h before being transferred into a crucible. The crucible containing the starting materials was first heated to 1000° C. in a heating chamber, and then incubated for 1 h. The resultant liquid of the smelted materials was allowed to pass through a cooling roller to give a glass frit, which was then crushed and sieved to give the glass powder B having a median particle size $D_{50}$ of 1.64 µm and a softening temperature of 426° C.

2. Preparation of Alloy Paste

Based on 100 wt % of the alloy aluminum paste, the alloy aluminum paste of the present invention was prepared from the following components in percentages by weight:

| | |
|---|---|
| an aluminum-silicon alloy powder | 38.9%; |
| an aluminum powder | 37.5%; |
| the glass powder A | 1.5%; |
| the glass powder B | 0.5%; |
| butyl carbitol | 7%; |
| texanol | 8%; |
| ethyl cellulose | 5%; |
| polyamide wax | 0.1%; |
| TDO | 1%; and |
| BYK-111 | 0.5%; | wherein the aluminum-silicon alloy has a median particle size $D_{50}$ of 6 µm and an oxygen content of 0.4 wt %; the aluminum powder has a median particle size $D_{50}$ of 8 µm and an oxygen content of 0.3 wt %; the boiling points of the organic solvents butyl carbitol and texanol are 231° C. and 255° C., respectively. The above prepared materials were mixed according to the ratios, and then ground and dispersed such that the fineness of the prepared paste did not exceed 15 µm.

Example 3

1. Preparation of Lead-Free Glass Powder

Preparation of glass powder A: Based on 100 wt % of the glass powder A, 10% of ZnO, 30% of $B_2O_3$, 30% of $Sb_2O_3$, 10% of $CaCl_2$, 10% of $K_2CO_3$ and 10% of $Cs_2O$ were prepared. In this example, $CaCl_2$ was adopted, although metal compounds of the other halogen elements were also possible by adjusting their ratios. The materials were then well mixed using a known mixer such as a disperser or a three-roll mill, and dried for 4 h before being transferred into a crucible. The crucible containing the starting materials was heated to 1050° C. in a heating chamber, and incubated for 2 h. The resultant liquid of the smelted materials was allowed to pass through a cooling roller to give a glass frit, which was then crushed and sieved to give the glass powder A having a median particle size $D_{50}$ of 2.17 µm and a softening temperature of 530.6° C.

Preparation of glass powder B: Based on 100 wt % of the glass powder B, 10% of $V_2O_5$, 40% of ZnO, 20% of $B_2O_3$, 5% of $P_2(CO_3)_5$, 10% of $MoO_3$, 5% of $CaCO_3$ and 10% of $Sr_2O$ were prepared. The materials were then well mixed using a known mixer such as a disperser or a three-roll mill, and dried for 3 h before being transferred into a crucible. The crucible containing the starting materials was first heated to 1000° C. in a heating chamber, and then incubated for 1 h. The resultant liquid of the smelted materials was allowed to pass through a cooling roller to give a glass frit, which was then crushed and sieved to give the glass powder B having a median particle size $D_{50}$ of 1.45 µm and a softening temperature of 435° C.

2. Preparation of Alloy Paste

Based on 100 wt % of the alloy aluminum paste, the alloy aluminum paste of the present invention was prepared from the following components in percentages by weight:

| | |
|---|---|
| an aluminum-silicon alloy powder | 56.5%; |
| an aluminum powder | 23.4%; |
| the glass powder A | 0.8%; |
| the glass powder B | 0.25%; |
| ethylene glycol butyl ether | 10%; |
| turpentine | 5%; |
| ethyl cellulose | 3.5%; |
| polyamide wax | 0.05%; |
| sorbitan trioleate | 0.3%; and |
| BYK-110 | 0.2%; | wherein the aluminum-silicon alloy has a median particle size $D_{50}$ of 5 µm and an oxygen content of 0.3 wt %; the aluminum powder has a median particle size $D_{50}$ of 7 µm and an oxygen content of 0.35 wt %; the boiling points of the organic solvents ethylene glycol butyl ether and turpentine are 227° C. and 173-175° C., respectively. The above prepared materials were mixed according to the ratios, and then ground and dispersed such that the fineness of the prepared paste did not exceed 15 µm.

Comparative Example 1

1. Preparation of Glass Powder

In part by mass, 15 parts of $B_2O_3$, 3 parts of $SiO_2$, 15 parts of $Bi_2O_3$, 60 parts of PbO and 7 parts of ZnO were prepared and well mixed in a mixer before being transferred to a porcelain crucible, followed by an incubation at 900° C. for 1 h in a muffle furnace. The melted glass powder particles were quenched with ionized water, ball-milled for 2.5 h, and sieved with a 200-mesh sieve to give a glass powder having a particle size $D_{90}$ of less than 2 µm.

2. Preparation of Cell Back Surface Field Aluminum Paste

The aluminum was a commercially available aluminum powder having a purity of 99.9% and an average particle size of 1.0-2.5 µm. In part by mass, 75 parts of the aluminum powder, 7 parts of the glass powder, 15 parts of an organic binder and 3 parts of an auxiliary agent were prepared, followed by the procedures as described in the examples.

Comparative Example 2

1. Preparation of Glass Powder

In part by mass, 17 parts of $B_2O_3$, 1 parts of $SiO_2$, 13 parts of $Bi_2O_3$, 65 parts of PbO and 4 parts of ZnO were prepared and well mixed in a mixer before being transferred to a porcelain crucible, followed by an incubation at 900° C. for 1 h in a muffle furnace. The melted glass powder particles were quenched with ionized water, ball-milled for 2.5 h, and sieved with a 200-mesh sieve to give a glass powder having a particle size $D_{90}$ of less than 2 μm.

2. Preparation of Cell Back Surface Field Aluminum Paste

The aluminum powder was a commercially available aluminum powder having a purity of 99.9% and an average particle size of 1.0-2.5 μm. In part by mass, 70 parts of the aluminum powder, 10 parts of the glass powder, 17 parts of an organic binder and 3 parts of an auxiliary agent were prepared, followed by the procedures as described in examples.

The performance analysis of the present invention is as follows:

The conductive pastes prepared in Examples 1 to 3 and the Comparative Examples 1 and 2 were printed by screen printing through a 250-mesh screen on a rear passivation surface of a monocrystalline silicon wafer of a PERC cell having a size of 125 mm×125 mm and a total area of passivation coating opening consisting of 0.5-1% of the area of the solar cell so as to form an electrode coating, followed by drying at 220° C. in a muffle furnace. After the drying, the aluminum electrode coating didn't not fall off. On the other side was then printed with a front silver paste, followed by sintering in a muffle furnace, with the peak temperature being 780° C. After the sintering, the electric properties were tested and the results are shown in Table 1.

TABLE 1

| | Electric properties | | | | | |
|---|---|---|---|---|---|---|
| Item | Open-circuit voltage (mV) | Short-circuit current (A) | Series resistance (Ω) | Parallel resistance (Ω) | Fill factor (%) | Conversion efficiency (%) |
| Example 1 | 676.26 | 10.013 | 1.76 | 194 | 80.68 | 22.35 |
| Example 2 | 676.61 | 10.014 | 1.66 | 367 | 80.86 | 22.42 |
| Example 3 | 666.3 | 10.03 | 1.34 | 218 | 81.01 | 22.26 |
| Comparative Example 1 | 669.4 | 9.852 | 2.05 | 832 | 79.85 | 21.557 |
| Comparative Example 2 | 659 | 9.787 | 1.71 | 826 | 80.63 | 21.289 |

As shown in the table above, the photoelectric conversion efficiency of the alloy paste for a PERC solar cell prepared according to the present invention was 22.26-22.42%, which was significantly improved compared to that in Comparative Example. The alloy paste disclosed herein is suitable for the PERC solar cell having a low opening rate, particularly a rear electrode having a total area of passivation coating opening consisting of 0.5-1% of the area of the solar cell. The alloy paste has advantages of good gap filling rate, complete and uniform BSF layer, reduced aluminum beads, and good boiling and adhesive performance.

Finally, it should be noted that the above examples are only for illustrating the technical schemes of the present invention but not for limiting the protection scope of the present invention. Although the present invention is described in detail with reference to the preferred schemes, it should be understood by those skilled in the art that modifications or equivalent substitutions can be made to the technical schemes of the present invention without departing from the spirit and scope of the technical schemes of the present invention.

What is claimed is:

1. An alloy aluminum paste for use on a rear of a PERC solar cell, wherein based on 100 wt % of the alloy aluminum paste, the alloy aluminum paste comprises the following components in percentages by weight:

| | |
|---|---|
| an aluminum-silicon alloy powder | 35-56.5%; |
| an aluminum powder | 17.5-37.5%; |
| a lead-free glass powder | 1-2%; |
| an organic solvent | 15-20%; |
| ethyl cellulose | 3-5%; |
| a thixotropic agent | 0.05-0.1%; and |
| a dispersant | 0.5-1.5%; | the aluminum-silicon alloy powder and the aluminum powder have a weight ratio of 1:1-3:1; the aluminum-silicon alloy has a median particle size $D_{50}$ of 5-6 μm and an oxygen content of 0.3-0.4 wt %; the aluminum powder has a median particle size $D_{50}$ of 7-8 μm, and an oxygen content of 0.35-0.45 wt %.

2. The alloy aluminum paste for use on a rear of a PERC solar cell according to claim 1, wherein the lead-free glass powder is prepared by mixing a glass powder A and a glass powder B; based on 100 wt % of the lead-free glass powder, the glass powder A consists of 60-90% by weight and the glass powder B consists of 10-40% by weight; the glass powder A has a median particle size $D_{50}$ of 1-3 μm and a softening temperature of 500-600° C.; the glass powder B has a median particle size $D_{50}$ of 1.3-1.8 μm and a softening temperature of 400-450° C.

3. The alloy aluminum paste for use on a rear of a PERC solar cell according to claim 2, wherein based on 100 wt % of the glass powder A, the glass powder A is prepared from 0-40% of ZnO, 1-40% of $B_2O_3$, 30-40% of $Sb_2O_3$ and 0-70% of $M_xN_y$, by weight, wherein the element M is an alkali metal or alkaline earth metal, the element N is at least one selected from O or $CO_3$ and a halogen, x is 1 or 2, and y is 1 or 2.

4. The alloy aluminum paste for use on a rear of a PERC solar cell according to claim 3, wherein the element M is at least one selected from Ba, Ca, Sr, Na, K, Rb and Cs.

5. The alloy aluminum paste for use on a rear of a PERC solar cell according to claim 2, wherein based on 100 wt % of the glass powder B, the glass powder B is prepared from 10-50% of $V_2O_5$, 0-30% of ZnO, 5-40% of $B_2O_3$, 0-20% of $P_2O_5$ or $P_2(CO_3)_5$, 0-20% of $WO_3$ or $MoO_3$, and 10-40% of $RQ_z$, wherein the element R is an alkaline earth metal, the element Q is at least one selected from O or $CO_3$ or a halogen, and z is 1 or 2.

6. The alloy aluminum paste for use on a rear of a PERC solar cell according to claim 5, wherein the element R is at least one selected from Ba, Ca and Sr.

7. The alloy aluminum paste for use on a rear of a PERC solar cell according to claim 1, wherein the organic solvent has a boiling point of 170-250° C.

8. The alloy aluminum paste for use on a rear of a PERC solar cell according to claim 1, wherein the organic solvent is one or more selected from butyl carbitol, butyl carbitol acetate, texanol, ethylene glycol butyl ether, terpineol and turpentine.

9. The alloy aluminum paste for use on a rear of a PERC solar cell according to claim 1, wherein the dispersant is one or a mixture of more selected from TDO, sorbitan trioleate, BYK-110 and BYK-111.

10. A method for using the aluminum alloy pastes on a rear of a PERC solar cell according to claim 1, wherein the alloy aluminum paste is applied to a PERC solar cell having a passivation coating opening consisting of 0.5-1% of the area of the solar cell.

* * * * *